(12) United States Patent
Sakiyama

(10) Patent No.: US 6,249,006 B1
(45) Date of Patent: Jun. 19, 2001

(54) ELECTROMAGNETIC FIELD SHIELDING DEVICE

(75) Inventor: Kazuyuki Sakiyama, Osaka (JP)

(73) Assignee: Matsushita Electric Industrial Co., Ltd., Osaka-fu (JP)

(*) Notice: Subject to any disclaimer, the term of this patent is extended or adjusted under 35 U.S.C. 154(b) by 0 days.

(21) Appl. No.: 09/077,392

(22) PCT Filed: Oct. 3, 1997

(86) PCT No.: PCT/JP97/03556

§ 371 Date: May 28, 1998

§ 102(e) Date: May 28, 1998

(87) PCT Pub. No.: WO98/15161

PCT Pub. Date: Apr. 9, 1998

(30) Foreign Application Priority Data

Oct. 4, 1996 (JP) .................................................. 8/264274

(51) Int. Cl.$^7$ .................................................... B64G 1/54
(52) U.S. Cl. ..................................... 250/505.1; 250/515.1
(58) Field of Search .............................. 250/505.1, 515.1; 361/111, 113, 115

(56) References Cited

U.S. PATENT DOCUMENTS 5,270,551 * 12/1993 Kamimura et al. ............... 250/505.1
5,786,975 * 7/1998 Dunzan et al. .................... 250/505.1

FOREIGN PATENT DOCUMENTS

| 3938238 | 5/1991 | (DE) . |
| 62-97399 | 5/1987 | (JP) . |
| 2159595 | 6/1990 | (JP) . |
| 3280595 | 12/1991 | (JP) . |
| 4120297 | 10/1992 | (JP) . |
| 8116197 | 5/1996 | (JP) . |
| 8186396 | 7/1996 | (JP) . |
| 9001861 | 2/1990 | (WO) . |
| 9426084 | 11/1994 | (WO) . |

* cited by examiner

Primary Examiner—Kiet T. Nguyen
(74) Attorney, Agent, or Firm—Price and Gess

(57) ABSTRACT

The electromagnetic field shielding apparatus of the present invention includes the electromagnetic field detection coil 21 for detecting an AC leakage electromagnetic field and the parallel resonance circuit 22-24 whose circuit constants are predetermined so that the resonance frequency matches the frequency of the electromotive force induced by the electromagnetic field detection coil 21. The resistor 24 of the parallel resonance circuit 22-24 consumes energy so that the strengths of the magnetic and electrical fields passing through the electromagnetic field detection coil 21 are suppressed.

12 Claims, 18 Drawing Sheets

Fig. 18
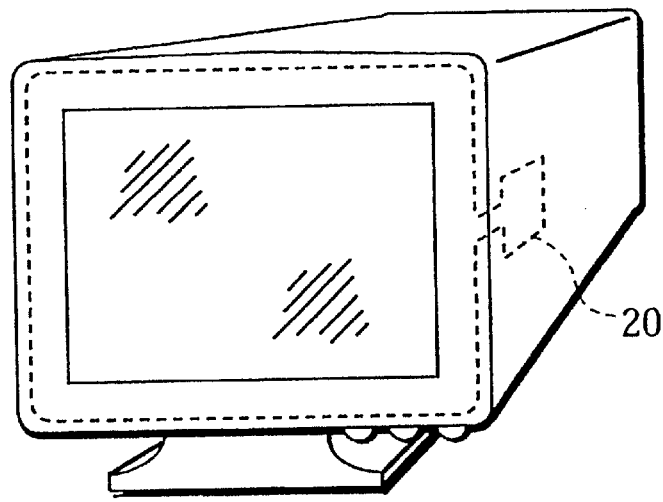
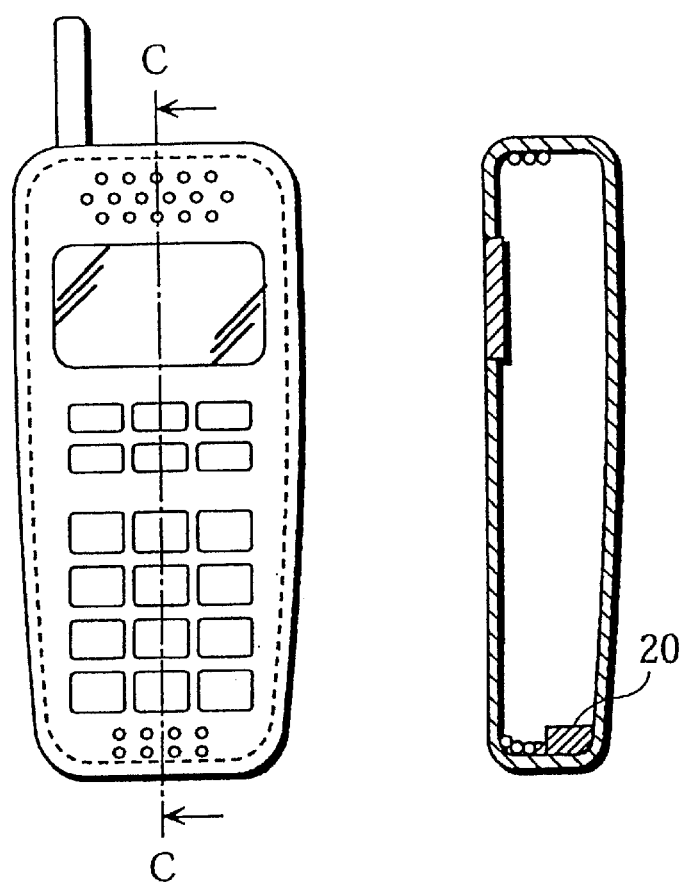
FIG. 19(a)  FIG. 19(b)

ELECTROMAGNETIC FIELD SHIELDING DEVICE

FIELD OF THE INVENTION

The present invention relates to an apparatus which shields an electromagnetic field emerging from the inside of an electrical device, and in particular to a resonance-type shield and an active shield which both use electronic circuitry.

DESCRIPTION OF THE PRIOR ART

Electrical and electronic devices can generate electromagnetic fields. While weak, such fields can make other devices work erroneously or have adverse effects on the health of users, so that devices need to be shielded.

Shield members made of electric conductors or ferromagnetic materials are conventionally used to shield the electromagnetic fields (see *Journal of the Electrical Society* Vol. 116, April 1996, p203–p217).

FIGS. 21(*a*) and 21(*b*) are drawings that show a conventional method for shielding an electromagnetic field with a shield member.

FIG. 21(*a*) shows a state where an electromagnetic field generated in an electrical device is emerging from the opening 11 of the chassis 10.

FIG. 21(*b*) shows a state where the opening 11 is covered with the shield member 12 to shield the electromagnetic field.

When the shield member 12 is composed of an electrically conductive material, the generated electromagnetic field is reflected back into the device chassis by eddy currents which are generated in the shield member as a reaction to the leakage electromagnetic field. Conversely, when the shield member 12 is composed of a magnetic material that is more magnetically permeable than air, the magnetic component of the electromagnetic field is confined within the device by the shield member, thereby preventing the electromagnetic field from emerging from the opening.

As described below, however, there are problems with this conventional shield method using the shield member 12.

The first problem is that the opening 11 needs to be covered with a sheet or mesh shield member 12 to produce a high shield effect. Therefore, if the opening 11 is an opening which something is inserted into or removed from, such as a disk slot of a floppy disk drive, or if the opening is positioned by a moving mechanism, it is not possible to apply these conventional methods as they are. A complicated shield mechanism interlocking with the moving mechanism is necessary.

The second problem is that when various kinds of electromagnetic fields of different strengths or frequencies are generated in a device or when the strength or frequency of an electromagnetic field varies over time, a uniform shield effect cannot be produced with a single shield member 12.

The third problem is that when the shield member 12 is composed of a magnetic material, there will be a limit on the strength of the magnetic field which the shield member 12 can shield. For instance, it is very difficult for a shield member 12 of a magnetic material to shield a strong magnetic field over 1.5 tesla.

With regard to the above problems, the first object of the present invention is to provide an electromagnetic field shielding apparatus which shields an electromagnetic field that emerges from an opening of a chassis without covering the opening, thereby keeping the opening unobstructed.

The second object of the present invention is to provide a flexible electromagnetic field shielding apparatus which can easily cope with various kinds of electromagnetic fields of different strengths and frequencies.

The third object of the present invention is to provide an electromagnetic field shielding apparatus which can produce a uniform shield effect without changing parts or materials of the apparatus even if the strength or frequency of the electromagnetic field varies over time.

The fourth object of the present invention is to provide an electromagnetic field shielding apparatus which can shield a strong magnetic field over 1.5 tesla.

SUMMARY OF THE INVENTION

The resonance-type electromagnetic field shielding apparatus of the present invention includes an electromagnetic field detection means which includes a coil for detecting an electromagnetic field, and a resonance means which consumes electricity, where the circuit constants of respective parts of the resonance means are predetermined so that the resonance means is tuned to the frequency of the electromotive force induced by the electromagnetic field detection means.

With this apparatus, the electromagnetic field detection means detects an electromagnetic field, an electromotive force is induced in the coil, the electromotive force is supplied to the resonance means, and the energy of the electromotive force is consumed therein. As a result, the strength of the electromagnetic field is suppressed, thereby achieving a shield effect.

By providing the electromagnetic field detection means including a coil around the edge of an opening of an electrical device from which an unnecessary electromagnetic field is emerging, the strength of the electromagnetic field passing through the electromagnetic field detection means is suppressed. Therefore, the electromagnetic field emerging from the opening is shielded without covering the opening to keep it open, thereby achieving the first object.

Here, the resonance means may be a parallel resonance circuit including L, C, and R electronic parts or may be an electric conductor which can be used as a distributed constant circuit.

With this structure, by changing these circuit parts (the electronic parts or the electric conductor), a resonance means causing a different energy consumption or a resonance means having a different resonance frequency can be obtained without difficulty, thereby achieving the second and fourth objects.

The L, C, and R electronic parts may be circuit parts with variable circuit constants, and the electromagnetic field shielding apparatus may be provided with a means for identifying a center frequency of the electromotive force and a means for determining and controlling the circuit constants to produce resonance at the identified center frequency.

With this structure, the apparatus changes the resonance frequency to follow variation in the frequency or strength of an electromagnetic field, or changes the amount of the energy consumption, thereby achieving the third object.

The electromagnetic field shielding apparatus of the present invention may be an active electromagnetic field shielding apparatus which includes an electromagnetic field detection means for detecting an electromagnetic field, an electromagnetic field generation means for generating a counteractive electromagnetic field, and a control means for controlling the electromagnetic field generation means so that the electromagnetic field generation means generates a counteractive electromagnetic field for canceling out the electromagnetic field detected by the electromagnetic field detection means.

With this apparatus, the electromagnetic field generation means generates an electromagnetic field to counteract the leakage electromagnetic field detected by the electromagnetic field detection means. Therefore, by making the electromagnetic field detection means and the electromagnetic field generation means target the same space, the electromagnetic field in the space is canceled out.

Here, the electromagnetic field detection means and the electromagnetic field generation means may be hollow coils whose hollow parts are identical or have identical center axes, and may be provided around the edge of the opening of an electrical device from which an electromagnetic field is emerging.

In this manner, the electromagnetic field emerging from the inside of an electrical device through its opening is canceled out, thereby achieving the first object.

Also, by selecting the constants of the circuit parts appropriately or by replacing the circuit parts with parts having variable circuit constants, the second and third objects are achieved.

BRIEF DESCRIPTION OF THE DRAWINGS

FIG. 4(*b*) is a sectional view taken along line A—A of FIG. 4(*a*);

FIG. 17(*b*) shows the waveform of the signal of the center frequency component of the induced electromotive force Vs (the dashed line) and the waveform of the filter signal V0 output from the band-pass filter 53*a* (the solid line);

FIG. 17(*c*) shows the waveform of the delayed signal V1 output from the delay unit 53*b* (and the voltage waveform V2 output from the power amplification unit 53*c*);

FIG. 18 shows an example of the electromagnetic field shielding apparatus 20 provided on the inside of the front of a CRT device;

FIG. 19(*a*) shows an example of the electromagnetic field shielding apparatus 20 provided on the inside of the front of a mobile phone;

FIG. 19(*b*) is a sectional view taken along line C—C of FIG. 19(*a*);

FIG. 20(*b*) is a sectional view taken along line D—D of FIG. 20(*a*);

FIG. 21(*b*) is a drawing used to describe the conventional technique where the opening 11 is covered with the shield member 12 to block the electromagnetic field.

DESCRIPTION OF THE PREFERRED EMBODIMENT

The following is a detailed description of embodiments of the present invention, with reference to the drawings.

<Embodiment 1>

Embodiment 1 is the resonance-type electromagnetic field shielding apparatus which uses electronic circuitry.

Figure 1:
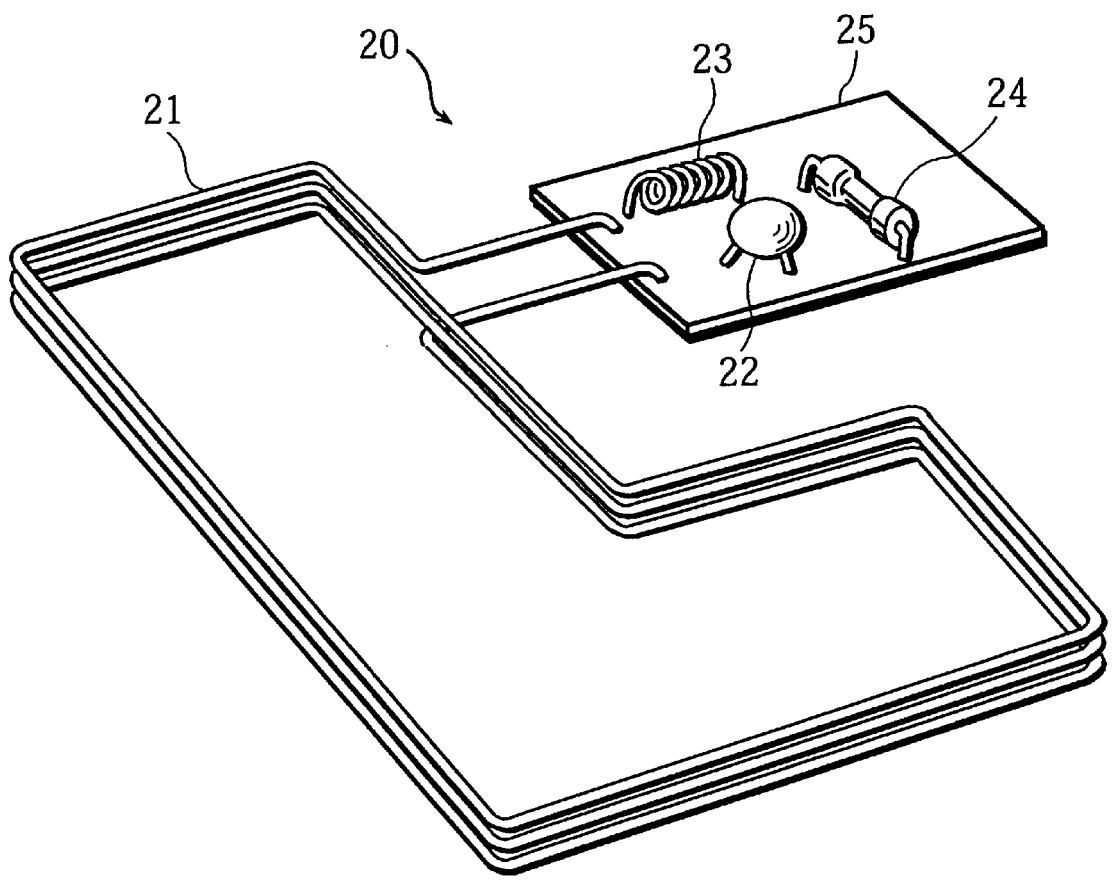
FIG. 1 shows the appearance of the electromagnetic field shielding apparatus 20 of Embodiment 1.

FIG. 1 shows the appearance of the electromagnetic field shielding apparatus 20 of Embodiment 1.

Figure 2:
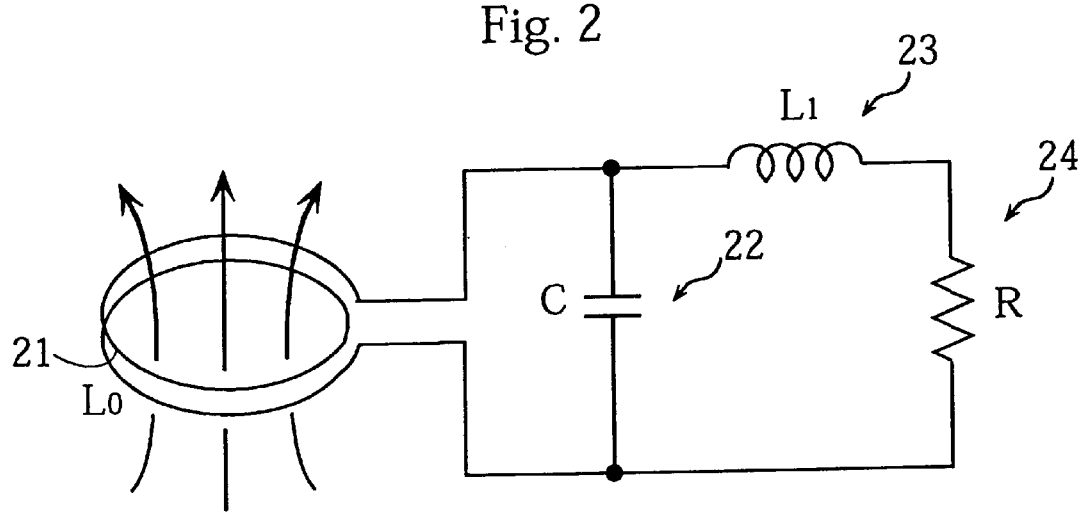
FIG. 2 is a circuit diagram of the electromagnetic field shielding apparatus 20.

FIG. 2 is a circuit diagram of the electromagnetic field shielding apparatus 20.

Figure 3:
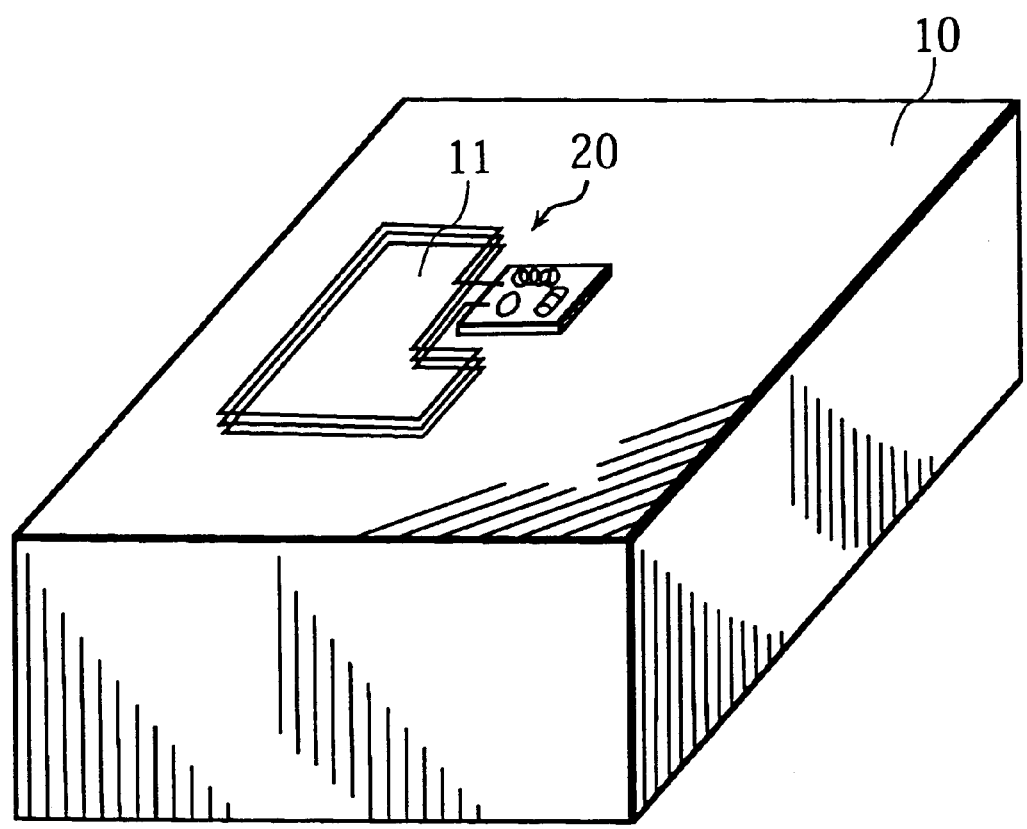
FIG. 3 shows the overall appearance of the chassis 10 of an electrical device and the electromagnetic field shielding apparatus 20, where the electromagnetic field shielding apparatus 20 is provided on the outside of the chassis 10 of the electrical device around the edge of the opening 11.

FIG. 3 shows the overall appearance of the chassis 10 of an electrical device and the electromagnetic field shielding apparatus 20, where the electromagnetic field shielding apparatus 20 is provided on the outside of the chassis 10 to shield an electromagnetic field emerging from the opening 11 of the chassis 10 of the electrical device.

FIG. 4(*a*) shows the overall appearance of the chassis 10 of an electrical device and the electromagnetic field shielding apparatus 20, where the electromagnetic field shielding apparatus 20 is provided on the inside of the chassis 10 of the electrical device.

Figure 4A:
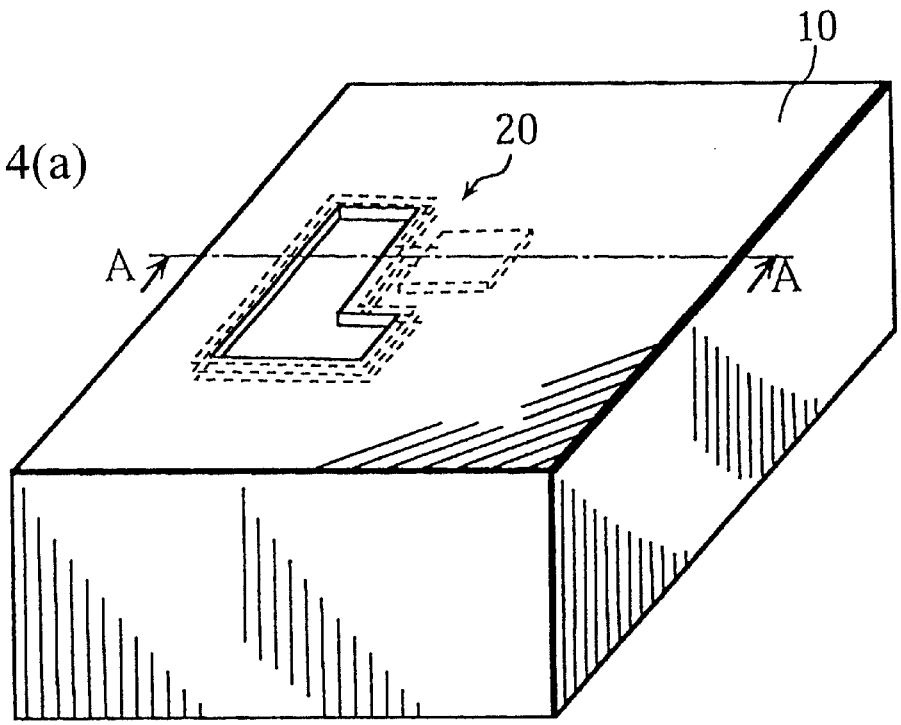
FIG. 4(*a*) shows the overall appearance of the chassis 10 of an electrical device and the electromagnetic field shielding apparatus 20, where the electromagnetic field shielding apparatus 20 is provided on the inside of the chassis 10 of the electrical device.
Figure 4B:
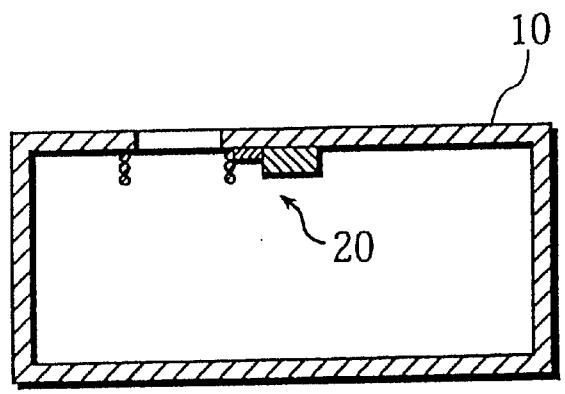

FIG. 4(b) is a sectional view taken along line B—B of FIG. 4(a).

The electromagnetic field shielding apparatus 20 includes the electromagnetic field detection coil 21, the capacitor 22, the coil 23, the resistor 24, and the circuit board 25, where the capacitor 22, the coil 23, and the resistor 24 are mounted on the circuit board 25.

The electromagnetic field detection coil 21 is a hollow coil for detecting an electromagnetic field and is an enamel coating copper wire which is wound in an L shape to surround the opening 11.

The induced electromotive force Vs, which is expressed by Formula 1 below and is proportionate to the variation in the magnetic flux Φ passing through the electromagnetic detection coil 21, is generated in the electromagnetic field detection coil 21.

$$Vs = -N\frac{d\phi}{dt}$$ (Formula 1)

where N is the number of turns of the electromagnetic field detection coil 21.

As is apparent from Formula 1, the electromagnetic field shielding apparatus 20 only detects variation in a leakage "flux" (an AC leakage flux), it may be said that the electromagnetic field shielding apparatus 20 detects an "electromagnetic field" because an electric field is also generated at the place where magnetic flux varies.

The capacitor 22, the coil 23, and the resistor 24 which are mounted onto the circuit board 25 act as the load when the electromotive force Vs induced in the electromagnetic field detection coil 21 is the signal source to the load. The elements construct a parallel resonance circuit whose resonance frequency f0 is expressed by Formula 2 below.

$$f0 = \frac{1}{2\pi}\sqrt{\frac{1}{L1C} - \frac{R^2}{L1^2}}$$ (Formula 2)

where C is the capacitance (F) of the capacitor 22, L1 the inductance (H) of the coil 23, and R the resistance value (Ω) of the resistor 24. The specific values of these C, L1, and R are predetermined so that center frequency (the frequency of a signal component having the largest quantity in the frequency spectrum) of the leakage magnetic flux which is the target of the electromagnetic field shielding apparatus 20 matches the resonance frequency f0 expressed by Formula 2 above. For instance, the combined use of a 0.01 μF capacitor 22, a 10 μH coil 23, and a 10Ω resistor 24 achieves an electromagnetic field shielding apparatus which shields a 478 KHz electromagnetic field.

The following is a description of the technical basis of the shield effect produced by the electromagnetic field shielding apparatus 20.

When an AC electromagnetic field passes through the electromagnetic field detection coil 21, the AC-induced electromotive force Vs shown in Formula 1 is generated by variation in a magnetic flux in the electromagnetic field. This AC signal Vs is supplied to the pre-tuned parallel resonance circuit including the elements 22–24 (hereinafter this circuit is called "the parallel resonance circuit 22-24" or "the resonance circuit 22-24"). In the resonance circuit 22-24, resonance is caused, generating electricity which is accumulated in the capacitor 22.

The resistor 24 with positive resistance is inserted into the resonance circuit 22-24 to consume electricity. The consumption of electricity by the resistor 24 means the consumption of the electromotive force induced in the electromagnetic field detection coil 21, that is, the release of energy of the leakage electromagnetic field. Therefore, the consumption of the electricity by the resistor 24 achieves the result that the electromagnetic field is shielded.

That is to say, because the electromotive force Vs induced by the electromagnetic detection coil 21 is attenuated by the resistor 24 in the parallel resonance circuit, the variation in the magnetic flux Φ passing through the electromagnetic detection coil 21 is suppressed and vanishes. It is apparent from Formula 3 below, which is one of Maxwell's equations, that, when there is no variation in a magnetic flux Φ (namely variation in the magnetic field H or variation in flux density B) in an AC electromagnetic field, the electric field E is also zero in the electromagnetic field detection coil 21.

$$rotE = -\frac{dB}{dt} \text{ (where } B = \mu H\text{)}$$ (Formula 3)

Therefore, the magnetic field and the electric field in the electromagnetic field detection coil 21, that is, the electromagnetic field that attempts to pass through the electromagnetic field detection coil 21 can be shielded.

The following is a description of results of a simulation of the shield effect of the electromagnetic field shielding apparatus 20 having the above structure.

Figure 5A:
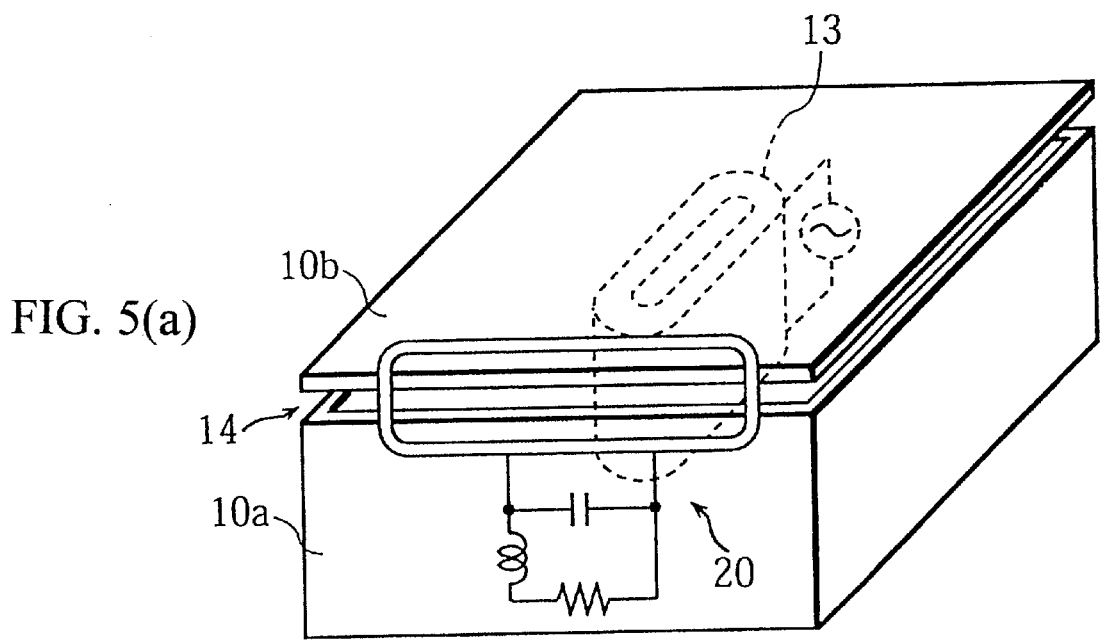
FIGS. 5(*a*) to 5(*c*) show a simulation model used to verify the shield effect of the electromagnetic field shielding apparatus 20, where FIG. 5(*a*) is a perspective view, FIG. 5(*b*) is a top end view, and FIG. 5(*c*) is a sectional view taken along line B—B of FIG. 5(*b*)
Figure 5B:
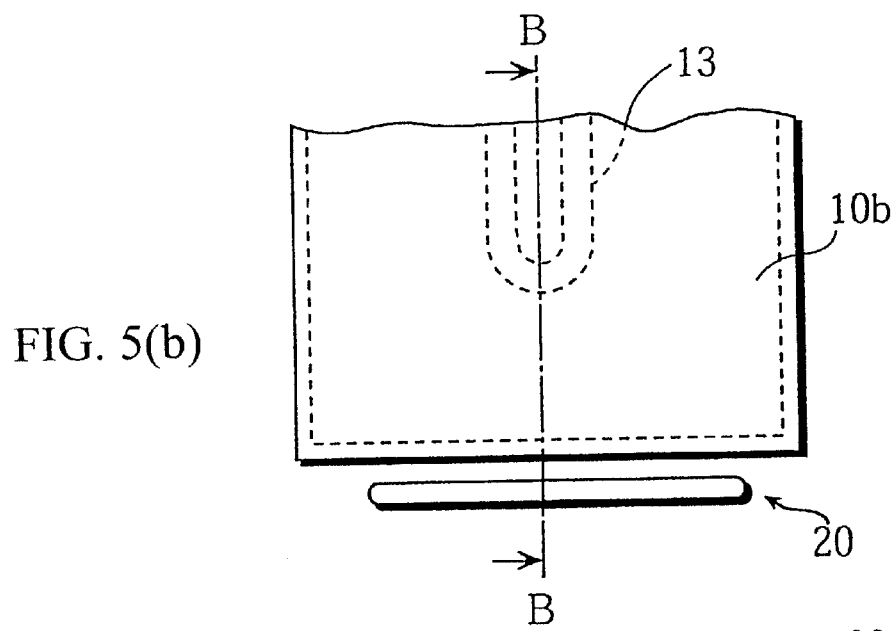
Figure 5C:
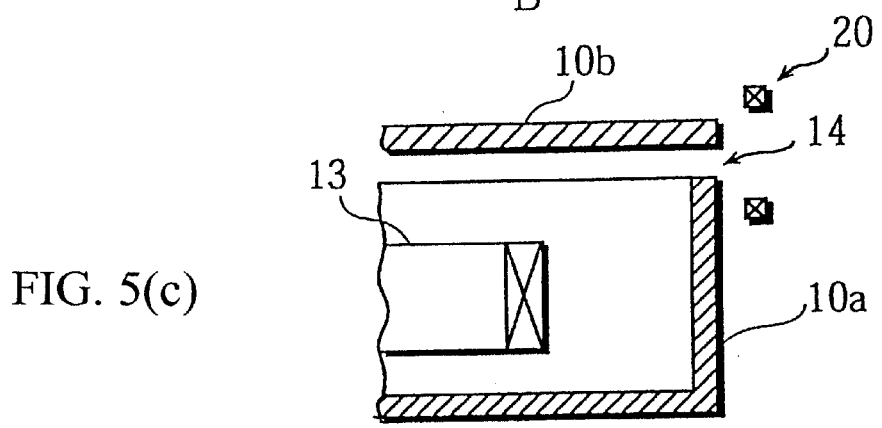

FIGS. 5(a) to 5(c) show the simulation model used to verify the shield effect of the electromagnetic field shielding apparatus 20, where FIG. 5(a) is a perspective view, FIG. 5(b) is a top end view, and FIG. 5(c) is a sectional view taken along line B—B of FIG. 5(b).

This model includes the coil 13 which generates a radiation electromagnetic field of 100 KHz, the lower chassis 10a which contains the coil 13 and is open upward, the upper chassis 10b which is placed over the lower chassis 10a with the opening gap 14 therebetween, and the electromagnetic field shielding apparatus 20 which is placed to shield the electromagnetic field that emerges from the front of the opening gap 14.

The lower chassis 10a and the upper chassis 10b are originally a rectangular chassis except for its top and the top, respectively, and are made of magnetic substances.

Figure 6:
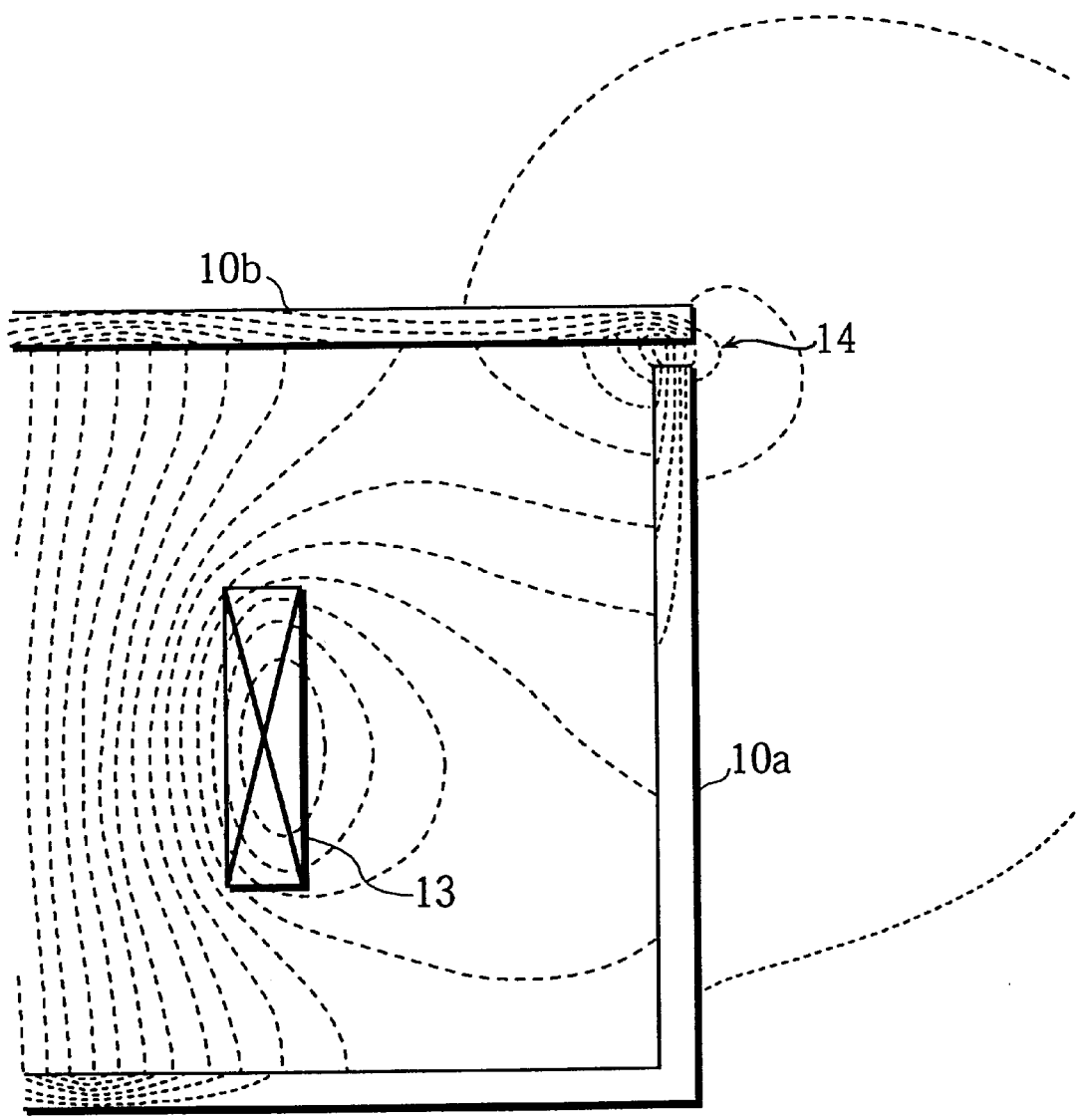
FIG. 6 shows the distribution of the leakage flux lines in the sectional view taken along line B—B of FIG. 5(*b*), when the model shown in FIGS. 5(*a*) to 5(*c*) is not provided with the electromagnetic field shielding apparatus 20.

FIG. 6 shows the distribution of the leakage flux lines in the sectional view taken along line B—B of FIG. 5(b), when the simulation model is not provided with the electromagnetic field shielding apparatus 20.

Figure 7:
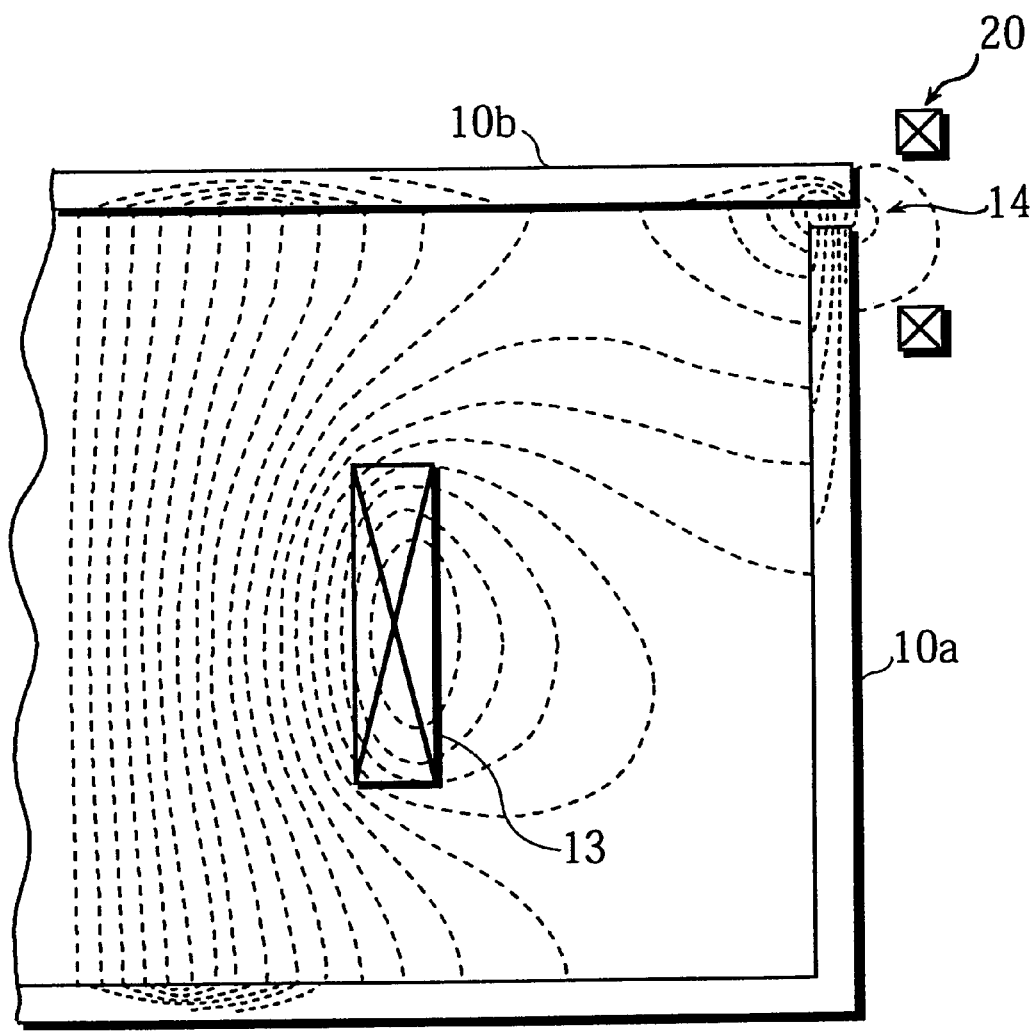
FIG. 7 shows the distribution of the leakage flux lines in the sectional view taken along line B—B of FIG. 5(*b*), when the model shown in FIGS. 5(*a*) to 5(*c*) is provided with the electromagnetic field shielding apparatus 20.

FIG. 7 shows the distribution of the leakage flux lines in the sectional view taken along line B—B of FIG. 5(b), when the simulation model is provided with the electromagnetic field shielding apparatus 20.

It is apparent from the FIGS. 6 and 7 that the leakage flux lines leaking from the chassis 10a and 10b are abated by the electromagnetic field shielding apparatus 20.

Figure 8:
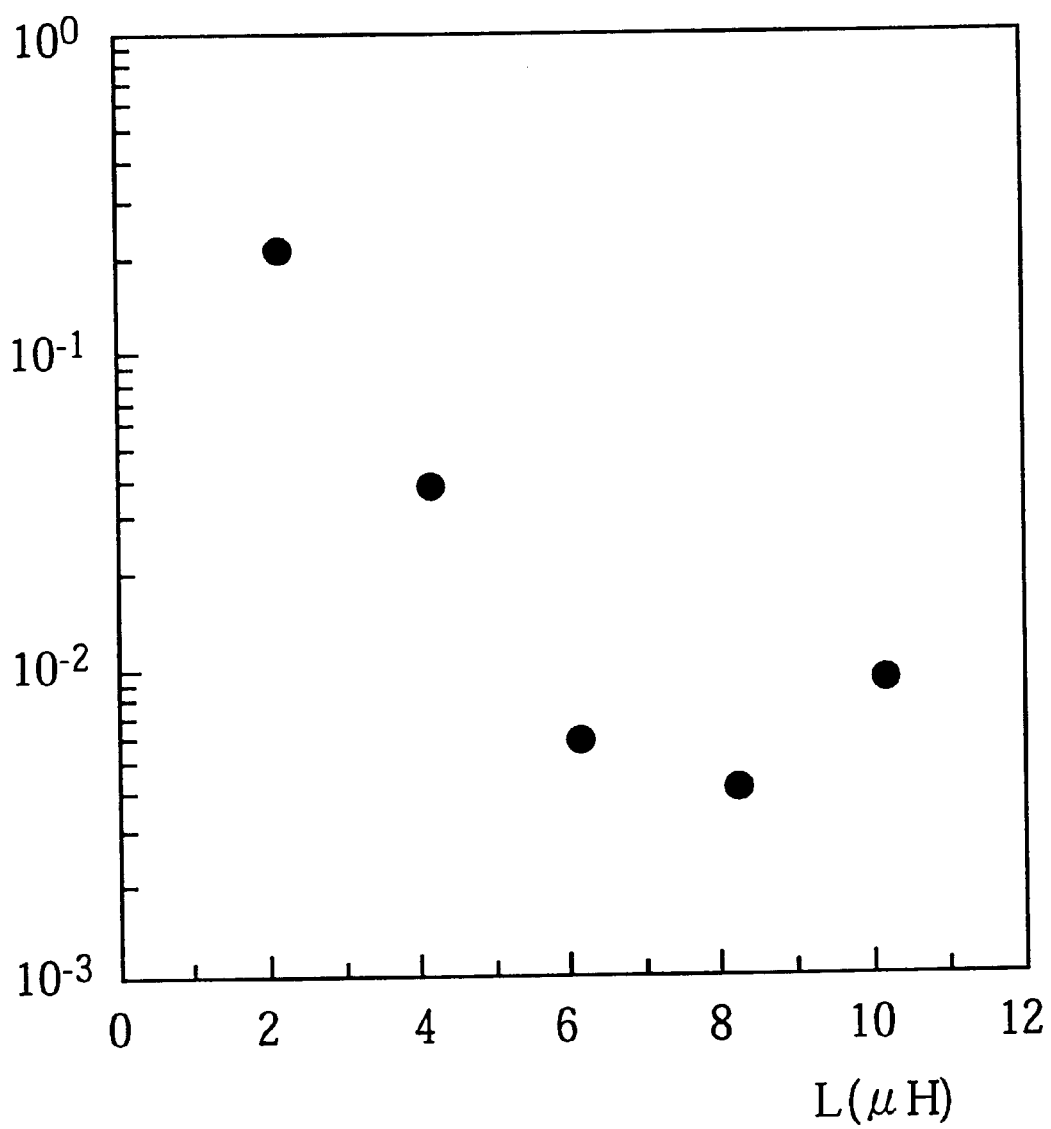
FIG. 8 is a graph of the shield effect on the leakage electromagnetic field when the inductance of the coil 23 of the electromagnetic field shielding apparatus 20 is changed.

FIG. 8 is a graph showing the shield effect on the electromagnetic field, when the capacitance of the capacitor 22 and the resistance value of the resistor 24 are fixed at constant values and the inductance of the coil 23 is changed in the electromagnetic field shielding apparatus 20. The vertical axis shows the shield effect on the leakage electromagnetic field, namely the strength of the magnetic field when the electromagnetic field shielding apparatus 20 is provided, on the assumption that the strength of the leakage magnetic field without the electromagnetic field shielding apparatus 20 is one.

It is apparent from FIG. 8 that the profoundest effect is produced by tuning the resonance frequency of the parallel resonance circuit 22-24 in the electromagnetic field shielding apparatus 20 to the frequency of the AC electromagnetic field generated in the chassis 10a and 10b.

As described above, the resonance-type electromagnetic field shielding apparatus 20 of Embodiment 1 of the present invention shields the electromagnetic field passing through the electromagnetic field detection coil 21. Furthermore, because this electromagnetic field detection coil 21 can be formed in any shape, it is possible to shield the electromagnetic field emerging from an opening of a device chassis without covering the opening, thereby keeping the opening unobstructed.

Also, by appropriately selecting the electronic parts 22–24 of the parallel resonance circuit, an electromagnetic field shielding apparatus 20 which corresponds to various kinds of AC electromagnetic fields of different frequencies or strengths can be constructed without difficulty. For instance, by appropriately selecting the circuit constant, a strong magnetic field over 1.5 tesla can be shielded.

<Modification 1>

The following is a description of the electromagnetic field shielding apparatus 40 using a distributed constant circuit which is Modification 1 of the electromagnetic field shielding apparatus 20 of Embodiment 1.

Figure 9:
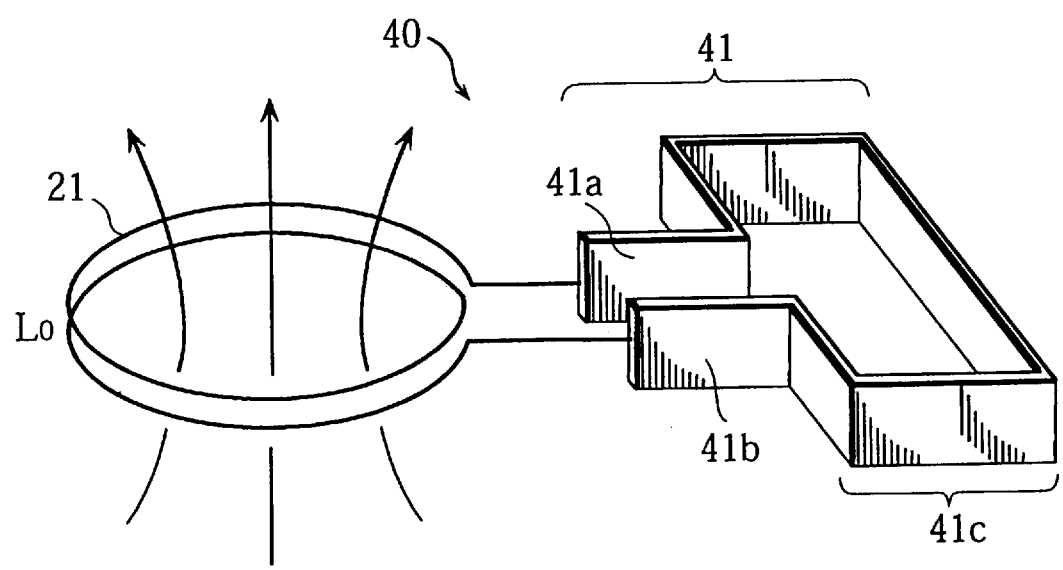
FIG. 9 shows the appearance of the electromagnetic field shielding apparatus 40 of Modification 1 of Embodiment 1.

FIG. 9 shows the appearance of the electromagnetic field shielding apparatus 40 of Modification 1.

The electromagnetic field shielding apparatus 40 includes the electromagnetic field detection coil 21 and the plate-shaped electric conductor 41 and is a shielding apparatus for an AC electromagnetic field of a higher frequency than in Embodiment 1, which is a high frequency at which the apparatus itself can be used as a distributed constant circuit.

The electric conductor 41 is an aluminum plate, for instance. The end parts 41a and 41b, which are connected to the electromagnetic field detection coil 21, are placed to face each other, and the main part 41c except for the end parts 41a and 41b is bent in rectangular form.

The electric conductor 41 has a resistance value which is determined by its metal material, the end parts 41a and 41b have capacitance because they face each other, and the main part 41c corresponds to a one-turn coil. Therefore, it may be said that the electric conductor 41 constructs a cavity resonator corresponding to the resonance circuit 22-24 of Embodiment 1. As a result, the electromagnetic field shielding apparatus 40 of Modification 1 produces the same shield effect as Embodiment 1 on a high frequency leakage electromagnetic field.

The following is a description of the shield principle of the shielding apparatus using a distributed constant circuit, such as the electromagnetic field shielding apparatus 40, and conditions for producing a shield effect with this shielding apparatus.

Figure 10:
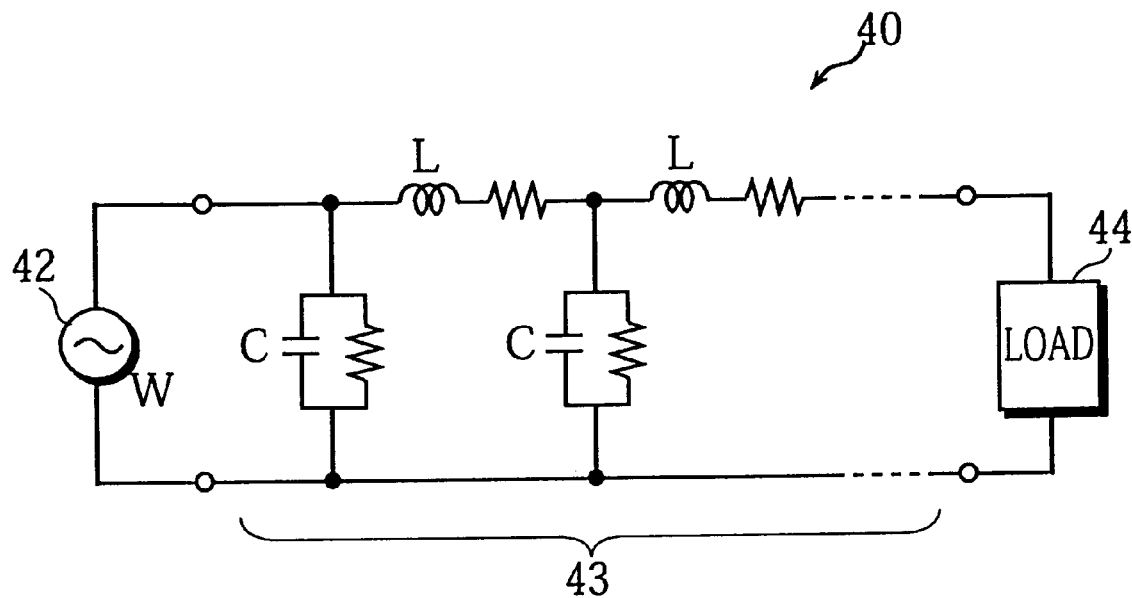
FIG. 10 shows the distributed constant circuit used to shows the shield principle of the electromagnetic field shielding apparatus 40.

As shown in FIG. 10, the electromagnetic field shielding apparatus 40 can be regarded as a distributed constant circuit including the high frequency power source 42 corresponding to the electromagnetic field detection coil 21, the lines 43 transmitting electric power of the high frequency power source 42, and the load 44 connected to the ends.

Assuming that the direction from the power source 42 to the load 44 is the positive direction on x-axis, voltage V(x) and current I(x) at point x of a distributed constant circuit are expressed by Formula 4 and Formula 5 below.

$$V(X) = V1e^{-\gamma X} + V2e^{+\gamma X} \quad \text{(Formula 4)}$$

$$I(X) = \frac{\gamma}{Z}(V1e^{-\gamma X} - V2e^{+\gamma X}) \quad \text{(Formula 5)}$$

where Z is impedance per unit length of the lines and γ is a propagation constant (α+jβ, where α is an attenuation constant and β is a phase constant)

Here, on the assumption that the line 43 is a zero-loss line (α=0), Formula 4 and Formula 5 become Formula 6 and Formula 7, respectively.

$$V(X) = V1e^{-j\beta X} + V2e^{j\beta X} \quad \text{(Formula 6)}$$

$$I(X) = \frac{1}{Z0}(V1e^{-j\beta X} - V2e^{j\beta X}) \quad \text{(Formula 7)}$$

where characterisic impedance $Z0 = \frac{Z}{\gamma} = \sqrt{\frac{L}{C}}$ $\beta = \omega\sqrt{LC}$ $\beta = \omega\sqrt{LC}$ When the length of the lines 43 is A and impedance of the load 44 connected to the ends of the lines 43 is equal to characteristic impedance Z0 of the lines 43, Formula 8 and Formula 9 below should hold at the ends.

$$\frac{V(A)}{I(A)} = Z0 \quad \text{(Formula 8)}$$

$$\frac{V(A)}{I(A)} = Z0\frac{V1e^{-j\beta A} + V2e^{j\beta A}}{V1e^{-j\beta A} - V2e^{j\beta A}} \quad \text{(Formula 9)}$$

From Formula 8 and Formula 9, V2 equals to 0 so that there is no reflected wave V2exp (jbx).

That is to say, by matching the impedance of the lines 43 to that of the load 44, electric power supplied from the power source 42 is consumed by the load 44 without being reflected.

As described above, by matching the impedance of the AC electromagnetic field targeted by the electromagnetic field shielding apparatus 40 to those of the lines and load, a high-frequency electromagnetic can be shielded. This principle is fundamentally the same as that of the electromagnetic field shielding apparatus 20 of Embodiment 1 which shields an electromagnetic field of a comparatively low frequency by connecting the AC electromagnetic field targeted by the shielding apparatus 20 to the resonance circuit 22-24.

The following is a description of the general shield principle and conditions for producing a shield effect in Embodiment 1 and Modification 1.

Figure 11:
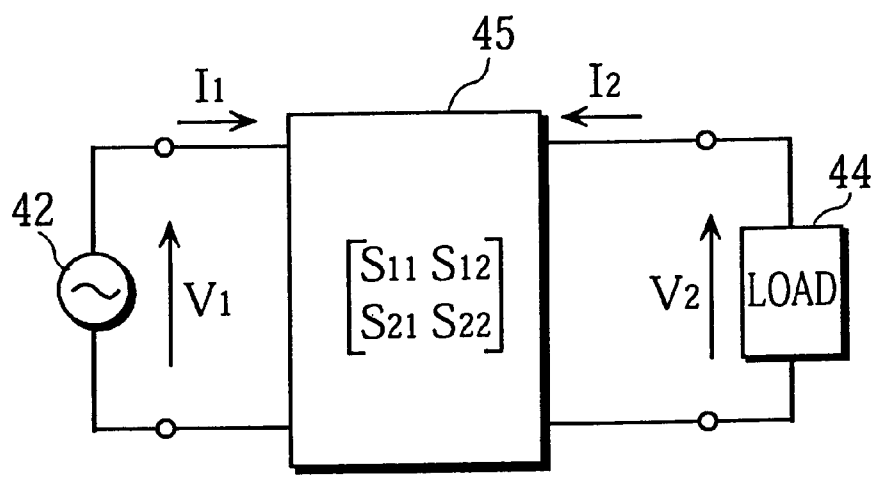
FIG. 11 is a standardized circuit diagram of the resonance-type electromagnetic field shielding apparatus and the electromagnetic field shielding apparatus using the distributed constant circuit of the present invention.

FIG. 11 is a standardized circuit diagram of the resonance-type electromagnetic field shielding apparatus and the electromagnetic field shielding apparatus using a distributed constant circuit of the present invention.

These electromagnetic field shielding apparatuses 20 and 40 may be considered to have the structure including the induced electromotive force 42 induced by an electromagnetic field, the load 44, and the four-terminal network 45 by which the induced electromotive force 42 and the load 44 are connected together.

In Formula 10 below, each parameter (S11, S12, S21, and S22) is determined so that S11 (voltage reflection coefficient) is as close as possible to zero, with V2=−RI2 holding.

$$\begin{bmatrix} V1 \\ I1 \end{bmatrix} = \begin{bmatrix} S11 & S12 \\ S21 & S22 \end{bmatrix} \begin{bmatrix} V2 \\ I2 \end{bmatrix} \quad \text{(Formula 10)}$$

The electromagnetic field shielding apparatus of the present invention is achieved by placing the four-terminal network 45 with the characteristic expressed by the parameters determined as described above between the load 44 and the electromagnetic field detection coil 21.

As described above, the parallel resonance electromagnetic field shielding apparatus 20 using integrated constant elements and the impedance matching electromagnetic field shielding apparatus 40 using a distributed constant circuit have a common principle that an electromagnetic field is shielded by transferring energy of the power source 42 in the four-terminal network 45 in one direction and consuming the energy using the load 44.

<Modification 2>

The following is a description of the electromagnetic field shielding apparatus 30 which shields a varying electromagnetic field by following the variation in this leakage electromagnetic field dynamically, as Modification 2 of the electromagnetic field shielding apparatus 20 of Embodiment 1.

Figure 12:
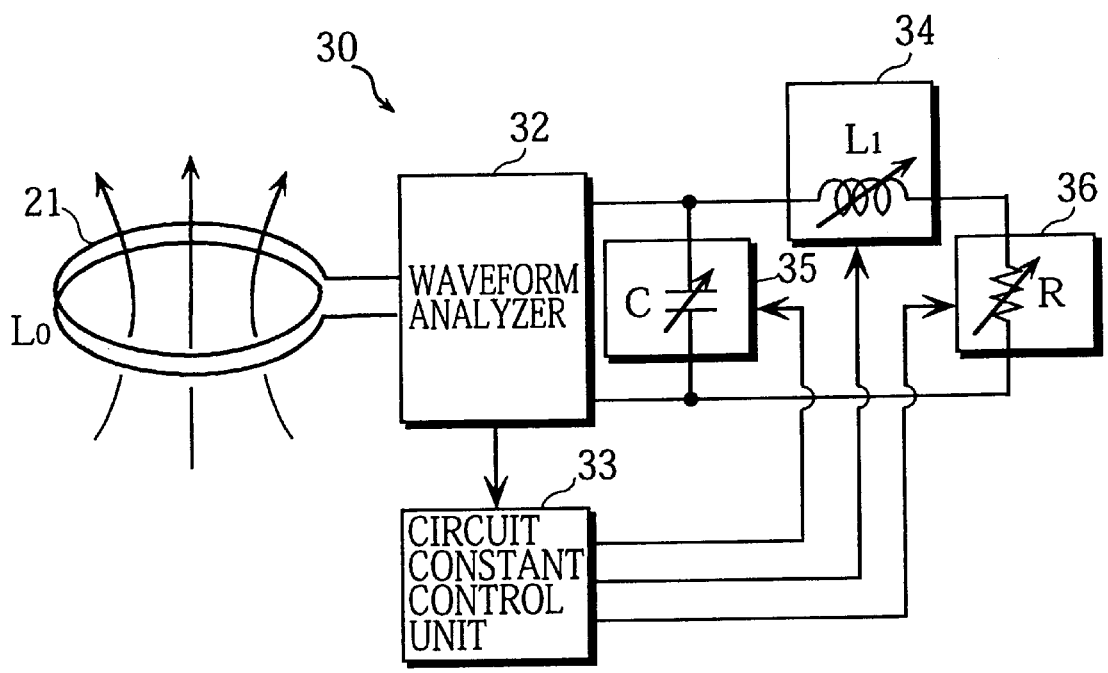
FIG. 12 is a block diagram of the electromagnetic field shielding apparatus 30 of Modification 2 of Embodiment 1.

FIG. 12 is a block diagram of the electromagnetic field shielding apparatus 30 of Modification 2.

The electromagnetic field shielding apparatus 30 includes the electromagnetic field detection coil 21, the waveform analyzer 32, the circuit constant control unit 33, the variable reactor 34, the variable capacitor 35, and the variable resistor 36. The apparatus 30 and Embodiment 1 are equivalent in being resonance shielding apparatuses, but differ in that the apparatus 30 has the function for being tuned to the frequency of an electromagnetic field detected by the electromagnetic field detection coil 21.

The waveform analyzer 32 includes a DSP (Digital Signal Processor) for performing FFT (Fast Fourier Transformation). The waveform analyzer 32 identifies the center frequency f0 of the electromotive force Vs induced by the electromagnetic field detection coil 21 at a constant time interval and informs the circuit constant control unit 33 of the center frequency f0.

Figure 13:
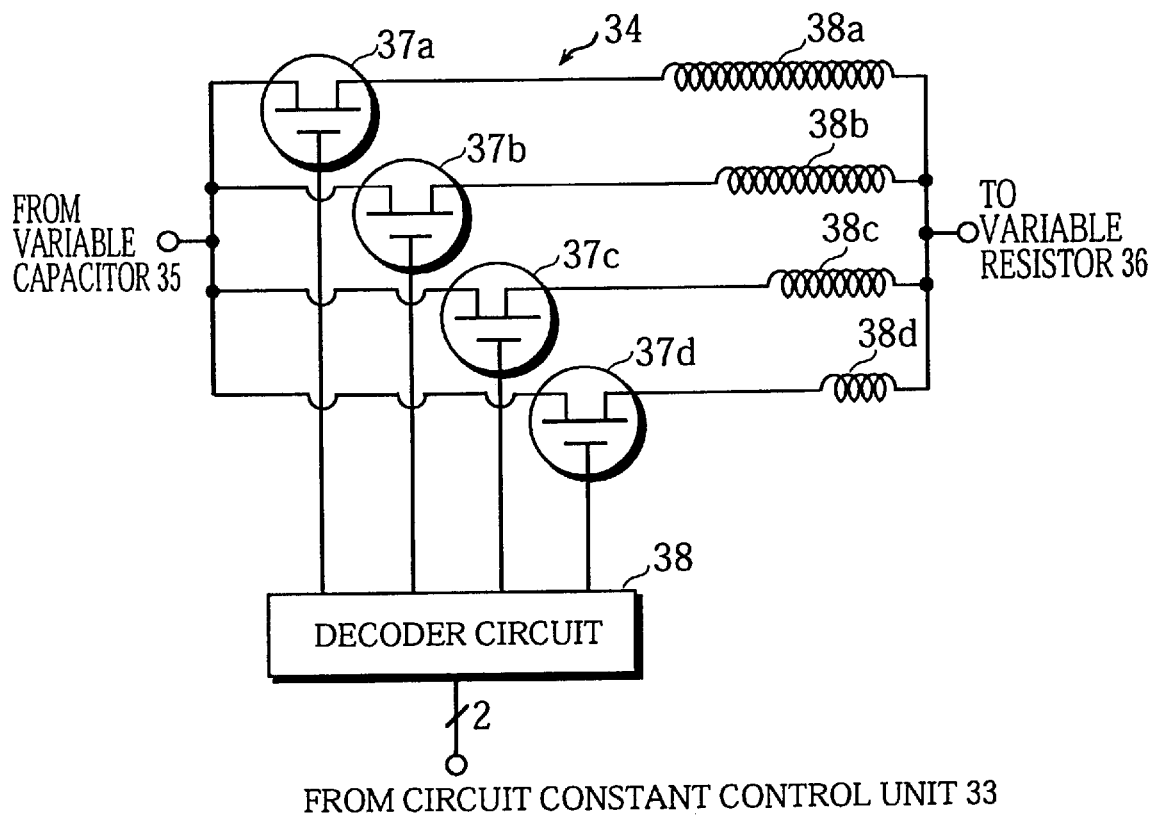
FIG. 13 is a block diagram showing the detailed structure of the variable reactor 34 of the electromagnetic field shielding apparatus 30.

As shown in FIG. 13, the variable reactor 34 includes MOS transistors 37a–37d which are a plurality of switches, the coils 38a–38d, and the decoder circuit 39 connected to respective gates of the MOS transistors 37a–37d. The variable reactor 34 changes an inductance in stages by turning ON only one out of the MOS transistors 37a–37d according to the instruction from the circuit constant control unit 33.

The variable capacitor 35 is, for instance, a variable capacity diode and its capacity is changed in a specific range by the control voltage from the circuit constant control unit 33.

The variable resistor 36 is, for instance, a MOS transistor and its resistance value is changed in a specific range by the control voltage from the circuit constant control unit 33.

The circuit constant control unit 33 controls the respective circuit constants of the electronic parts 34–36 according to Formula 2 above, so that the parallel resonance circuit including the elements 34–36 is tuned to the center frequency f0 indicated by the waveform analyzer 32.

Figure 14:
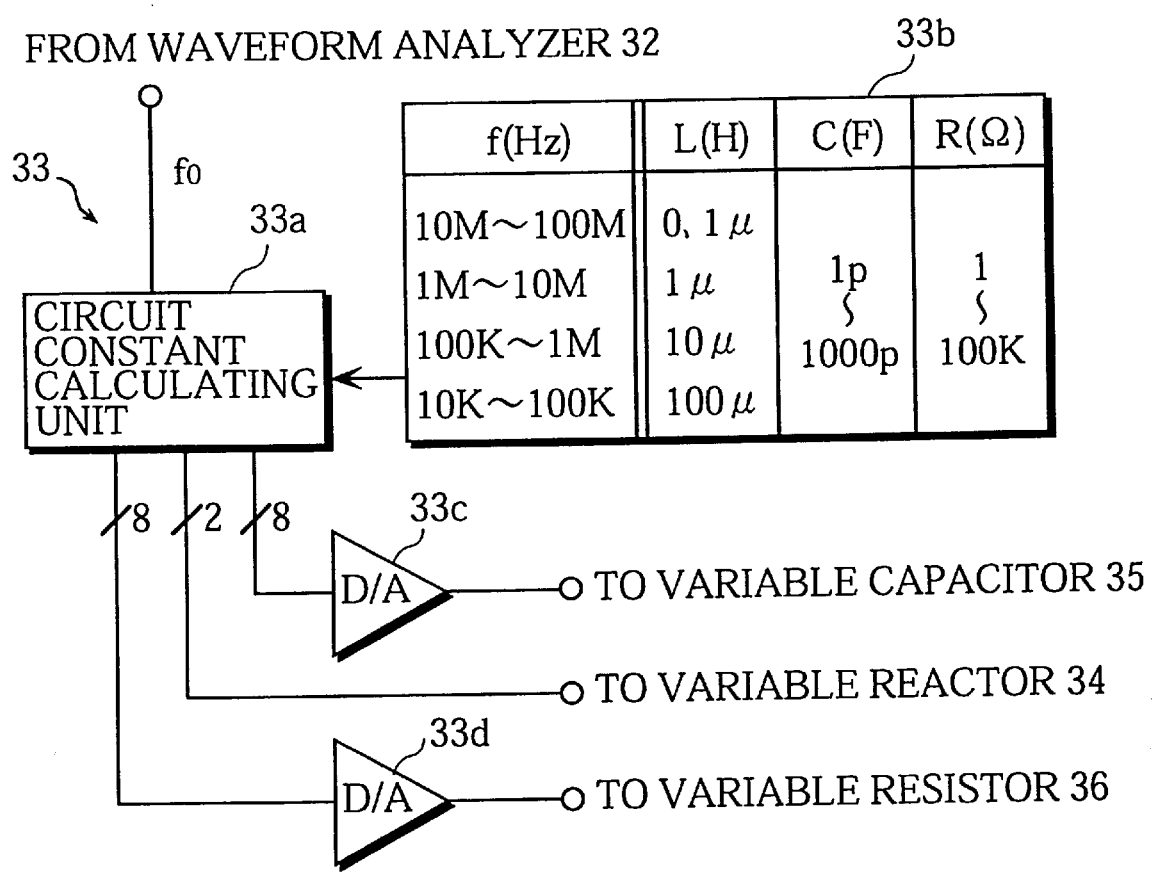
FIG. 14 is a block diagram showing the detailed structure of the circuit constant control unit 33 of the electromagnetic field shielding apparatus 30.

FIG. 14 is a block diagram showing a detailed structure of the circuit constant control unit 33.

The circuit constant control unit 33 includes the circuit constant storage table 33b for storing inductances to be selected for each center frequency f0 informed from the waveform analyzer 32 and an adjustable circuit constant range of each electronic circuit, circuit constant calculating unit 33a for calculating the respective optimal circuit constants of the electronic parts 34–36 according to the circuit constant storage table 33b, to the center frequency f0 informed from the waveform analyzer 32, and to Formula 2 above, and the D/A converters 33c and 33d for converting the calculated digital data into a control voltage.

With the electromagnetic field shielding apparatus 30 having the above structure of Modification 2, even if the frequency of the AC electromagnetic field passing through the electromagnetic field detection coil 21 varies, the circuit constants of circuit parts 34–36 are adjusted and are tuned following the varying frequency, so that a constant shield effect is always produced. This means that the electromagnetic field shielding apparatus 30 produces a constant shield effect without requiring changes to its construction or constituent materials in response to changes in the frequency of the electromagnetic field to be shielded.

<Embodiment 2>

Embodiment 2 relates to an active shield including an electromagnetic field generation means for canceling out an electromagnetic field.

Figure 15:
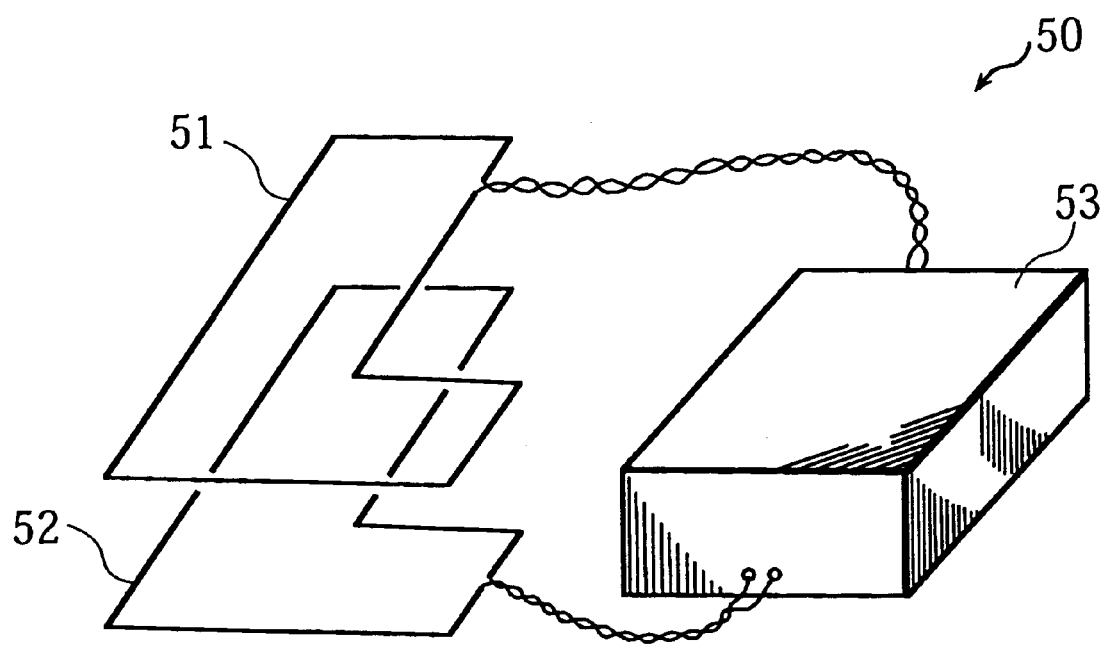
FIG. 15 shows the appearance of the electromagnetic field shielding apparatus 50 of Embodiment 2.

FIG. 15 shows the appearance of the electromagnetic field shielding apparatus 50 of Embodiment 2.

The electromagnetic field shielding apparatus 50 includes the electromagnetic field detection unit 51, the electromagnetic field generation unit 52, and the electromagnetic field control unit 53.

The electromagnetic field detection unit 51 is the same as the electromagnetic field detection coil 21 of Embodiment 1.

The electromagnetic field generation unit 52 is a hollow coil, whose conductor is wound in the same form and direction as the electromagnetic field detection unit 51. The electromagnetic field generation unit 52 is firmly attached to or is placed over the electromagnetic field detection unit 51 so that the spaces surrounded by both units are coincident or at least coaxial, and generates a counteractive electromagnetic field for canceling out a leakage electromagnetic field passing through the electromagnetic field detection unit 51.

The magnetic field control unit 53 is a control circuit for generating the reaction magnetic field by generating an electromotive force with a phase opposite to an induced electromotive force generated in the electromagnetic field detection unit 51 and by supplying the electromotive force to the electromagnetic field generation unit 52.

The apparatus 50 is mounted on an electrical apparatus in the manner shown in FIG. 3 or in FIGS. 4(a) and 4(b).

Figure 16:
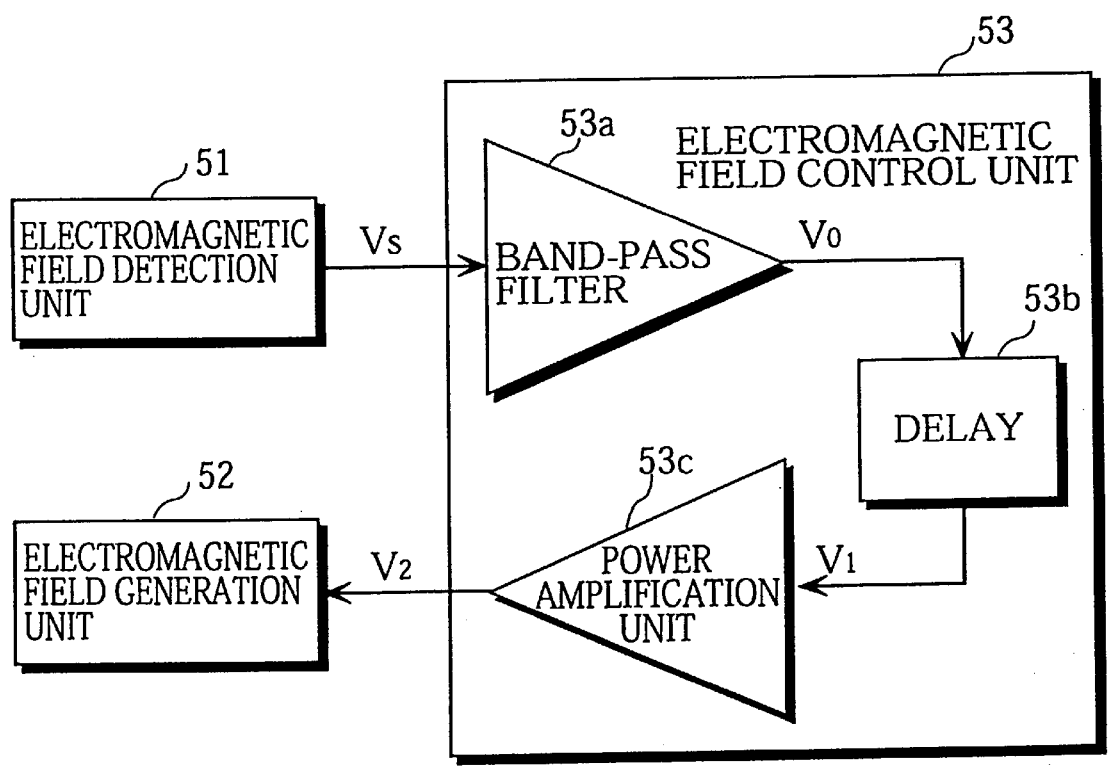
FIG. 16 is a block diagram of the electromagnetic field shielding apparatus 50.

FIG. 16 is a block diagram of the electromagnetic field shielding apparatus 50.

The electromagnetic field control unit 53 further includes the band-pass filter 53a, the delay unit 53b, and the power amplification unit 53c.

Figure 17:
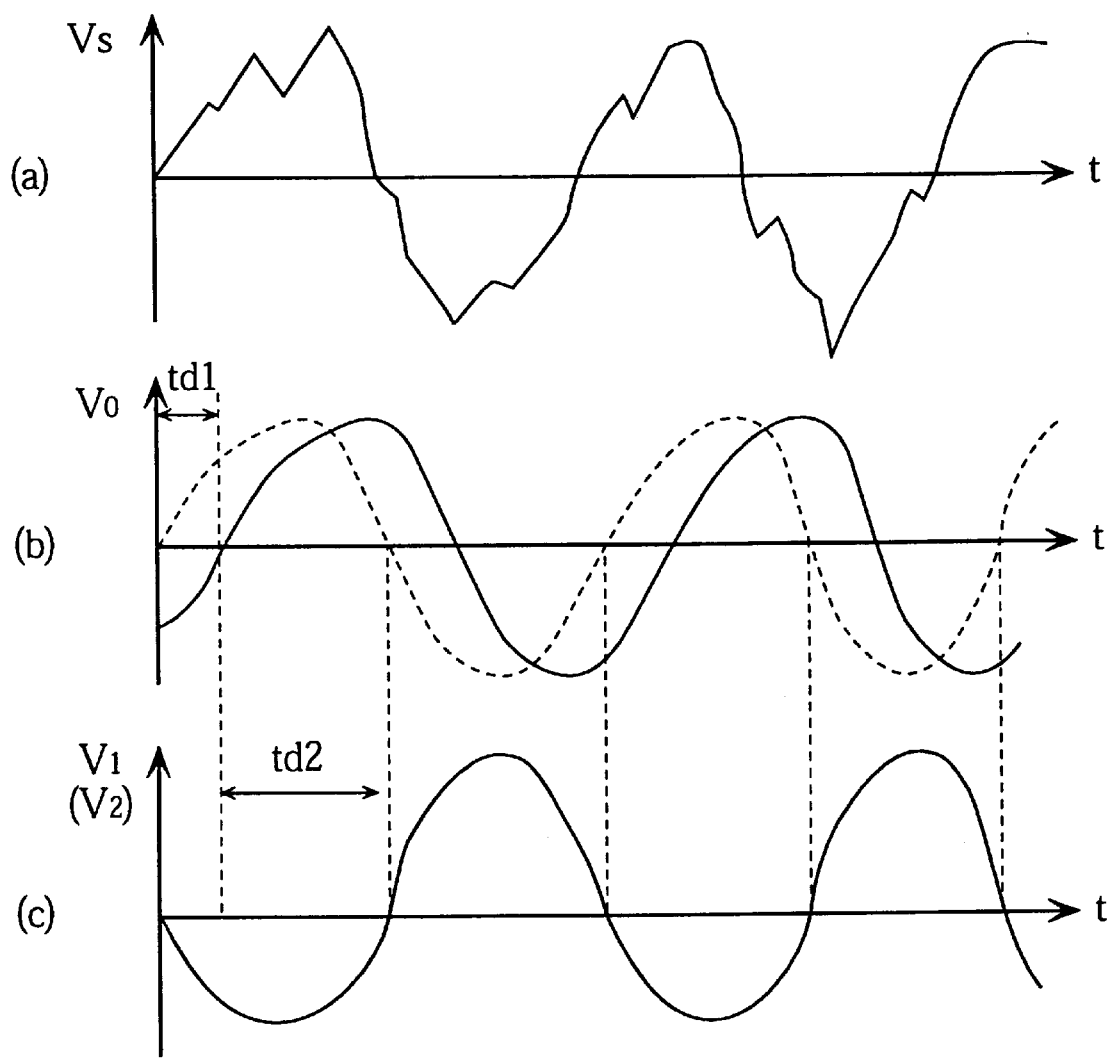
FIG. 17(*a*) shows the waveform of the induced electromotive force Vs generated in the electromagnetic field detection unit 51 of the electromagnetic field shielding apparatus 50.

FIGS. 17(a) to 17(c) are waveform diagrams for showing relations among phases of signals output from respective components. FIG. 17(a) shows the waveform of the induced electromotive force Vs generated in the electromagnetic field detection unit 51; FIG. 17(b) shows the waveform of the signal of the center frequency component of the induced electromotive force Vs (the dashed line) and the waveform of the filter signal V0 output from the band-pass filter 53a (the solid line); and FIG. 17(c) shows the waveform of the delayed signal V1 output from the delay unit 53b (this waveform has the same phase as the voltage waveform V2 output from the power amplification unit 53c).

The band-pass filter 53a is an active filter including an operational amplifier or the like for removing unnecessary frequency components out of the induced electromotive force Vs generated in the electromagnetic field detection unit 51. After the induced electromotive force Vs generated in the electromagnetic field detection unit 51 is amplified, the band-pass filter 53a passes and transmits to the delay unit 53b only the frequency component V0 whose band is the predetermined shield target.

The delay unit 53b includes a delay line for delaying the phase of the input signal V0 so that the electromagnetic field generated by the electromagnetic field generation unit 52 cancels out the leakage electromagnetic field passing through the electromagnetic field detection unit 51. For instance, if the band-pass filter 53a outputs the center frequency component V0 delayed by td1, the delay unit 53b delays the output center frequency component V0 by td2 to cause a phase delay of 180° in total.

The power amplification unit 53c is an AC amplifier for amplifying the electric power of the signal output from the delay unit 53b and supplies an alternating current for generating a counteractive electromagnetic field in the electromagnetic field generation unit 52.

The following is a description of the operation of the electromagnetic field shielding apparatus 50 having the above structure, according to formulas.

The induced electromotive force Vs, which is proportional to variation in the magnetic flux that passes through the coil and is expressed by Formula 11 below, is generated in the electromagnetic field detection unit 51.

$$Vs(t) = -N\frac{d\phi}{dt} \quad \text{(Formula 11)}$$

The band-pass filter 53a passes only the frequency component V0 with a specific band (f0) out of the induced electromotive force Vs, causes a delay of td1, and outputs the signal V0 expressed by Formula 12 below.

$$V0(t)=[Vs\ (t-td1)]f=f0 \quad \text{(Formula 12)}$$

By delaying the input signal V0 by td2, the delay unit 53b generates the signal V1 expressed by Formula 13, which is the center frequency component of the induced electromotive force Vs delayed by the phase of 180°.

$$V1(t) = V0(t - td2) \quad \text{(Formula 13)}$$
$$= -Vs(T)$$

The power amplification unit 53c generates the signal V2 expressed by Formula 14 which is the delay signal V1 amplified by k times so that an electromagnetic field having the same strength as the electromagnetic field is generated in the electromagnetic field generation unit 52.

$$V2(t)=-kVs(t) \quad \text{(Formula 14)}$$

As described above, with the electromagnetic field shielding apparatus 50 of Embodiment 2, the electromagnetic field having a specific frequency detected by the electromagnetic field detection unit 51 is canceled out by the electromagnetic field generated by the electromagnetic field generation unit 52 located over the electromagnetic field detection unit 51. As a result, the electromagnetic field within the electromagnetic field detection unit 51 vanishes, with the electromagnetic field being shielded.

With the electromagnetic field shielding apparatus of Embodiment 2, as in Embodiment 1, coils of the electromagnetic field detection unit 51 and the electromagnetic field generation unit 52 can be formed in any shape so that the electromagnetic field emerging from an opening of a device chassis can be shielded without covering the opening, thereby keeping the opening unobstructed.

Furthermore, by appropriately selecting the band which the band-pass filter 53a allows to pass, the delay time of the delay unit 53b, and the amplification factor of the power amplification unit 53c, an active shield corresponding to various kinds of AC electromagnetic fields having different frequencies or strengths can be constructed without difficulty. For instance, a strong magnetic field over 1.5 tesla can be shielded.

It should be noted here that although the electromagnetic field detection unit 51 is the coil for detecting an AC electromagnetic field in Embodiment 2, the present invention is not restricted to this structure and, for instance, the electromagnetic field detection unit 51 may be a vertical antenna or a Hall element which detects AC as well as DC magnetic fields. Various kinds of electromagnetic fields can be shielded when the electromagnetic field control unit 53 performs a control corresponding to the characteristic of the electromagnetic field detection unit 51.

Also, while the electromagnetic field detection unit 51 and the electromagnetic field generation unit 52 have individual coils, one coil may double as these coils. In this case, by providing in an electromagnetic field a coil doubling as the detection and generation coils of an electromagnetic field and by controlling the power supply to the coil, the electromotive force Vs induced in the coil becomes zero.

Still, while the electromagnetic field shielding apparatus 50 of Embodiment 2 targets an electromagnetic field with a specific frequency, the electromagnetic field shielding apparatus 50 may be a dynamic active shield following variation in an electromagnetic field by further including the waveform analyzer 32 and the circuit constant control unit 33, like the electromagnetic field shielding apparatus 30 of Modification 2 of Embodiment 1.

Furthermore, while one electromagnetic field shielding apparatus for shielding an electromagnetic field is used in Embodiments 1 and 2, a plurality of electromagnetic field shielding apparatuses corresponding to the distribution of an electromagnetic field may be installed. One electromagnetic field shielding apparatus may includes a plurality of electromagnetic field detection coils or a plurality of electromagnetic field generation coils.

<Application Example in Electrical Device>

The following is a description of examples of the electromagnetic field shielding apparatuses 20, 30, 40, and 50 of Embodiments 1 and 2 and Modifications 1 and 2 applied to an electronic or electrical device.

FIG. 18 shows an example of the electromagnetic field shielding apparatus 20 provided on the inside of the front of a CRT device.

With this structure, an unnecessary electromagnetic field, which is generated by the deflecting yoke or high-frequency flyback transformer in a CRT device and emerges from the display screen, is shielded so that user health problems caused by the electromagnetic field can be prevented.

FIGS. 19(a) and 19(b) show an example of the electromagnetic field shielding apparatus 20 provided on the inside of the front of a mobile phone.

With this structure, an unnecessary electromagnetic field radiated forward from a PLL synthesizer or transmission amplifier in the cellular phone is suppressed, reducing the influence of such fields on the health of users.

Figure 20A:
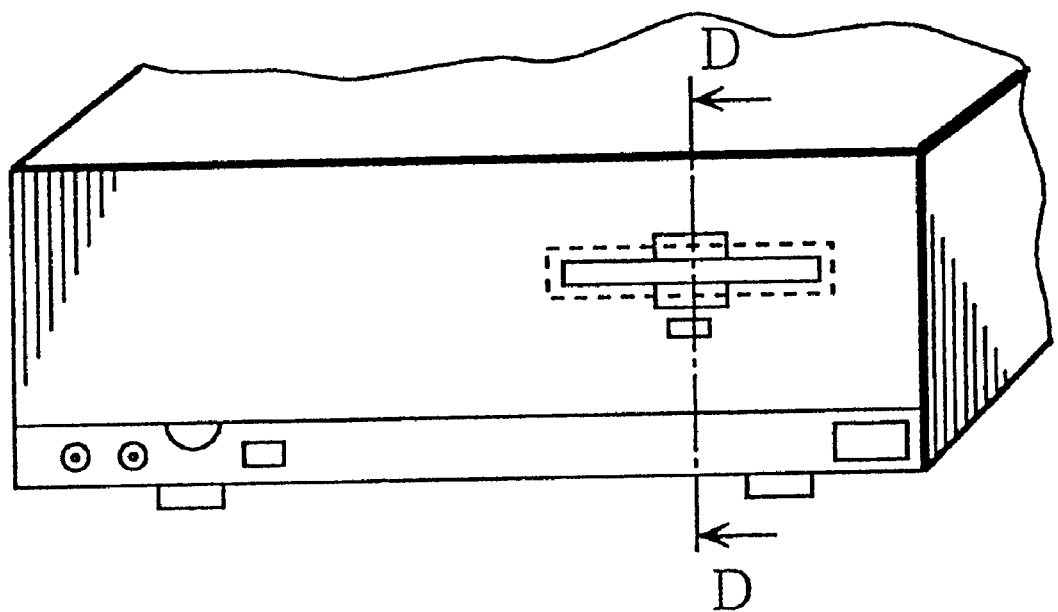
FIG. 20(*a*) shows an example of the electromagnetic field shielding apparatus 20 provided around the disk slot of the floppy disk drive of a personal computer.
Figure 20B:
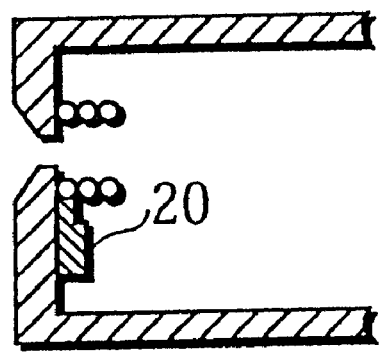
Figure 21A:
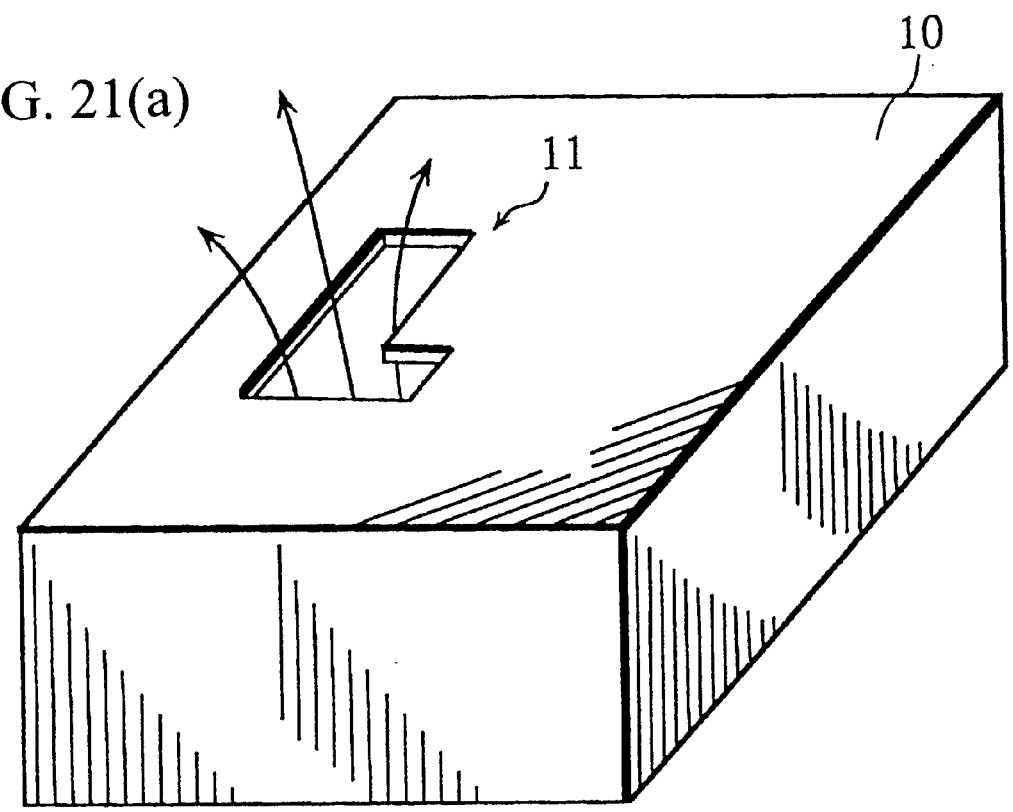
FIG. 21(*a*) shows the state where an electromagnetic field generated in an electrical device is emerging from the opening 11 of the chassis 10.
Figure 21B:
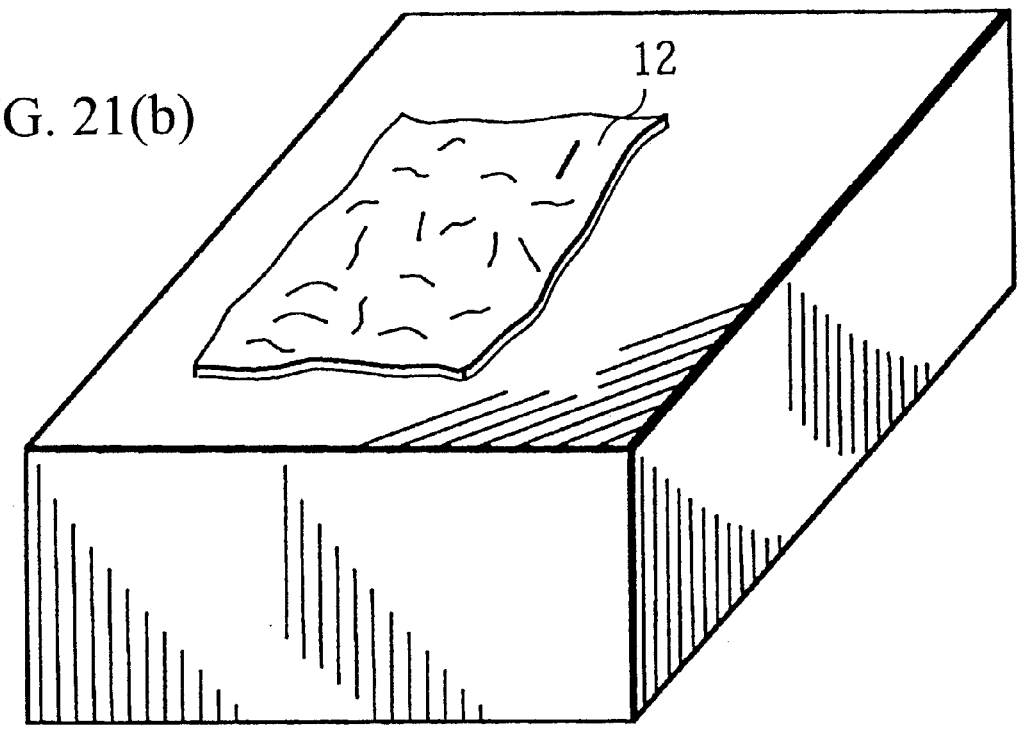

FIGS. 20(a) and 20(b) show an example of the electromagnetic field shielding apparatus 20 provided around the disk slot of the floppy disk drive of a personal computer.

With this structure, an electromagnetic field emerging from a disk slot of a personal computer can be shielded easily without covering the disk slot.

As described above, with the resonance-type electromagnetic field shielding apparatus and the active shield of the present invention, an electromagnetic field emerging from an opening of a device chassis is shielded without covering the opening to keep it open. A shielding apparatus, which can easily cope with various kinds of electromagnetic fields having different strengths and frequencies without changing components or raw materials of the apparatus, is produced, and an even shield effect is produced even if the strength or frequency of a leakage electromagnetic field varies over time.

As a result, adverse influence on human bodies and erroneous operation of devices due to the electromagnetic radiation from an electrical device are prevented and the bearing capacity against external electromagnetic interference, namely "immunity," is improved so that the shielding apparatus of the present invention has an enormous practical value as an EMC (Electromagnetic Compatibility) appliance.

Industrial Applicability

As described above, the electromagnetic field shielding apparatus of the present invention is used as a device for shielding an electromagnetic field emerging from an electrical or electronic device, such as a computer display device or a mobile phone, and as an apparatus for shielding an electromagnetic field emerging from an apparatus generating a strong magnetic field, such as MRI (Magnetic Resonance Imaging). In particular, the electromagnetic field shielding apparatus is suitable as an electronic device for easily shielding an electromaganetic field emerging through a disk slot of a floppy disk drive or through an open/close door without covering the opening of the disk slot or the door.

What is claimed is:

1. An apparatus which shields an electromagnetic field, the electromagnetic field shielding apparatus being characterized by comprising:
   an electromagnetic field detection means for detecting an electromagnetic field and converting the electromagnetic field into an electric signal; and
   a parallel resonance means for causing a parallel resonance which consumes power of the electric signal.

2. The electromagnetic field shielding apparatus defined in claim 1, wherein
   the electromagnetic field detection means is a coil.

3. The electromagnetic field shielding apparatus defined in claim 2, wherein
   the parallel resonance means includes an inductance element, a capacitance element, and a resistance element.

4. The electromagnetic field shielding apparatus defined in claim 3, wherein
   circuit constants of the inductance element, the capacitance element, and the resistance element are variable, and
   the electromagnetic field shielding apparatus further comprises:
   a frequency identification means for identifying a center frequency of the electric signal; and
   a circuit constant control means for controlling the circuit constants of the inductance element, the capacitance element, and the resistance element so that a resonance frequency of the parallel resonance means matches the identified center frequency.

5. The electromagnetic field shielding apparatus defined in claim 2, wherein
   the parallel resonance means is a plate-shaped electric conductor.

6. The electromagnetic field shielding apparatus defined in claim 5, wherein
   the electric conductor includes facing parts forming a capacitor and a loop part forming an inductor.

7. An electrical apparatus including a shielding apparatus for shielding an electromagnetic field leaking from a chassis,
   the electrical apparatus being characterized by the shielding apparatus comprising:
   an electromagnetic field detection means for detecting an electromagnetic field and converting the electromagnetic field into an electric signal; and
   a parallel resonance means for causing a parallel resonance which consumes power of the electric signal,
   the electromagnetic field detection means being a coil, and
   the parallel resonance means including an inductance element, a capacitance element, and a resistance element.

8. An electrical apparatus including a shielding apparatus for shielding an electromagnetic field leaking from an chassis,
   the electrical apparatus being characterized by the shielding apparatus comprising:
   an electromagnetic field detection means for detecting an electromagnetic field and converting the electromagnetic field into an electric signal; and
   a parallel resonance means for causing a parallel resonance which consumes power of the electric signal,
   the electromagnetic field detection means being a coil, and
   the parallel resonance means being a plate-shaped electric conductor which includes facing parts forming a capacitor and a loop part forming an inductor.

9. An electromagnetic field shielding apparatus, comprising:
   an electromagnetic field detection means for detecting an electromagnetic field, wherein the electromagnetic field detection means is a hollow coil for converting the detected field into an electrical signal;
   an electromagnetic field generation means for generating a counteractive electromagnetic field, wherein the electromagnetic generation means is a coil having either a hollow part identical to that of the electromagnetic field detection means or a hollow part having a center axis identical to that of the electromagnetic field detection means; and
   a control means for controlling the electromagnetic field generation means so that the electromagnetic field generations means generates a counter electromagnetic field which cancels out the detected electromagnetic field,
   the control means comprising
   a band-pass filter unit for only transmitting a component signal with a specific frequency band out of a plurality of component signals in the electrical signal; and
   an electrical supply unit for supplying electricity to the electromagnetic field means according to the transmitted component signal to generate the counteractive electromagnetic field.

10. The electromagnetic field shielding apparatus defined in claim 9, wherein the electrical supply means delays the transmitted component signal by a constant amount of phase and supplies the electricity according to the delayed component signal.

11. An electrical apparatus including a shielding apparatus for shielding an electromagnetic field leaking from an chassis, the electrical apparatus being characterized by the shielding apparatus comprising:
an electromagnetic field detection means for detecting an electromagnetic field;
an electromagnetic field generation means for generating a counteractive electromagnetic field; and
a control means for controlling the electromagnetic field generation means so that the counteractive electromagnetic field cancels out the detected electromagnetic field,
the electromagnetic field detection means being a hollow coil for converting the detected electromagnetic field into an electric signal, and
the electromagnetic field generation means is a coil which has either of a hollow part identical to that of the electromagnetic field detection means and a hollow part having a center axis identical to that of the hollow coil, and the control means comprising:
a band-pass filter unit for only transmitting a component signal with a specific frequency band out of a plurality of component signals in the electric signal; and
an electrical supply unit for supplying electricity to the electromagnetic field generation means according to the transmitted component signal to generate the counteractive electromagnetic field.

12. A method for shielding an electromagnetic field emerging from an opening of a electronic device chassis, comprising the steps of:

placing a coil around the opening of the chassis to convert the electromagnetic field emerging from the opening of the chassis into an electrical signal; and sending the electrical signal to a parallel-resonance circuit, the parallel-resonance circuit comprising an inductor, a resistor connected in series with the inductor, and a capacitor connected in parallel with the series connection of the inductor and the resistor.

* * * * *